(12) United States Patent
Di Iorio (10) Patent No.: US 6,713,996 B2
(45) Date of Patent: Mar. 30, 2004

(54) ULTRA LOW POWER TRACKED LOW VOLTAGE REFERENCE SOURCE

(75) Inventor: Ercole Di Iorio, Scurcola Marsicana (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/230,355

(22) Filed: Aug. 28, 2002

(65) Prior Publication Data

US 2003/0057931 A1 Mar. 27, 2003

(30) Foreign Application Priority Data

Aug. 30, 2001 (IT) ................... RM2001A0521

(51) Int. Cl.[7] ................................. G05F 3/16
(52) U.S. Cl. ........................................ 323/313
(58) Field of Search ................... 323/268, 270, 323/273, 275, 280, 312, 313; 327/535, 538–540

(56) References Cited

U.S. PATENT DOCUMENTS

| 5,394,078 A | * | 2/1995 | Brokaw | ............. 323/313 |
|---|---|---|---|---|
| 5,726,563 A | | 3/1998 | Bolton, Jr. | |
| 5,898,618 A | * | 4/1999 | Lakkapragada et al. | ............. 365/185.22 |
| 6,232,828 B1 | | 5/2001 | Smith et al. | |
| 6,452,414 B1 | | 9/2002 | Lorenz | |

OTHER PUBLICATIONS

G.A. Rincon–Mora et al., "A 1.1–V Current Mode and Piecewise–Linear Curvature–Corrected Bandgap Reference", IEEE Journal of Solid–State Circuits, vol. 33, N. 10, pp. 1551–1554, (Oct. 1988).

* cited by examiner

Primary Examiner—Matthew V. Nguyen
(74) Attorney, Agent, or Firm—Leffert Jay & Polglaze, PA (57) ABSTRACT

A reference voltage source for an integrated circuit includes a first voltage reference that is adjustable, a second voltage reference, a differential sensing device to compare a voltage provided by the first voltage reference to a voltage provided by the second voltage reference, a controller to provide a trim control signal to the first voltage reference in response to an output of the differential sensing device for adjusting the first voltage reference and to provide a signal to power down the second voltage reference after the first voltage reference has been adjusted.

28 Claims, 5 Drawing Sheets

ULTRA LOW POWER TRACKED LOW VOLTAGE REFERENCE SOURCE

RELATED APPLICATION

This application claims priority to Italian Patent Application Serial No. RM2001A000521, filed Aug. 30, 2001, entitled "Ultra Low Power Tracked Low Voltage Reference Source."

TECHNICAL FIELD

The present invention relates in general to a method and apparatus for generating a voltage reference, and, in particular, to a method and apparatus for generating a high precision, low-power voltage reference for a flash memory circuit.

BACKGROUND

In low-voltage low power flash memories, for example; where Vcc is between 1.65 and 1.95 V, there is a need for a highly precise voltage reference (Vref) source. This circuit is needed to calibrate the different on-chip power supplies required for operation of the memory. Usually Vref sources are bandgap reference voltage sources based on the compensated behavior of the P-N silicon diode junction. There are a number of bandgap reference voltage sources described in the literature. Many of these circuits offer good stability versus Vcc power supply, temperature range, and process parameter spread.

Unfortunately, precision bandgap reference voltage sources working at low Vcc voltages, such as Vcc of about 1.8 V, typically require a significant amount of current to operate. This current can be in the range of hundreds of microamps, which is too high for flash memories used in portable devices, such as cellular phones. The bandgap circuits also cannot be shut down in "power down" or in standby mode, otherwise latency would be too great when reading the memory in the power down or standby mode. While voltage reference circuits requiring only a few microamps are available, these circuits do not provide the stability required over a range of Vcc power supply voltages, temperatures and process parameter spreads.

For the reasons stated above and for additional reasons stated hereinafter, which will become apparent to those skilled in the art upon reading and understanding the present specification, there is a need in the art for a low current Vref source that has high stability over a range of Vcc power supply voltages, temperatures, and process parameter spreads. The above-mentioned shortcomings of traditional Vref sources and other problems are addressed by the present invention, at least in part, and will be understood by reading and studying the following specification.

Although, various embodiments have been illustrated using particular electronic components it will be understood by those of ordinary skill in the art that other circuit elements could be used to implement the invention and that the present invention is not limited to the arrangement of circuit elements disclosed. Moreover, it will also be understood in the art that the present invention could be applied to a Vref source circuit for use in devices other than flash memory circuits that operate on very low supply voltages. Therefore, the present invention is not limited to a Vref source circuit for very low voltage flash memory.

DETAILED DESCRIPTION

Figure 1:
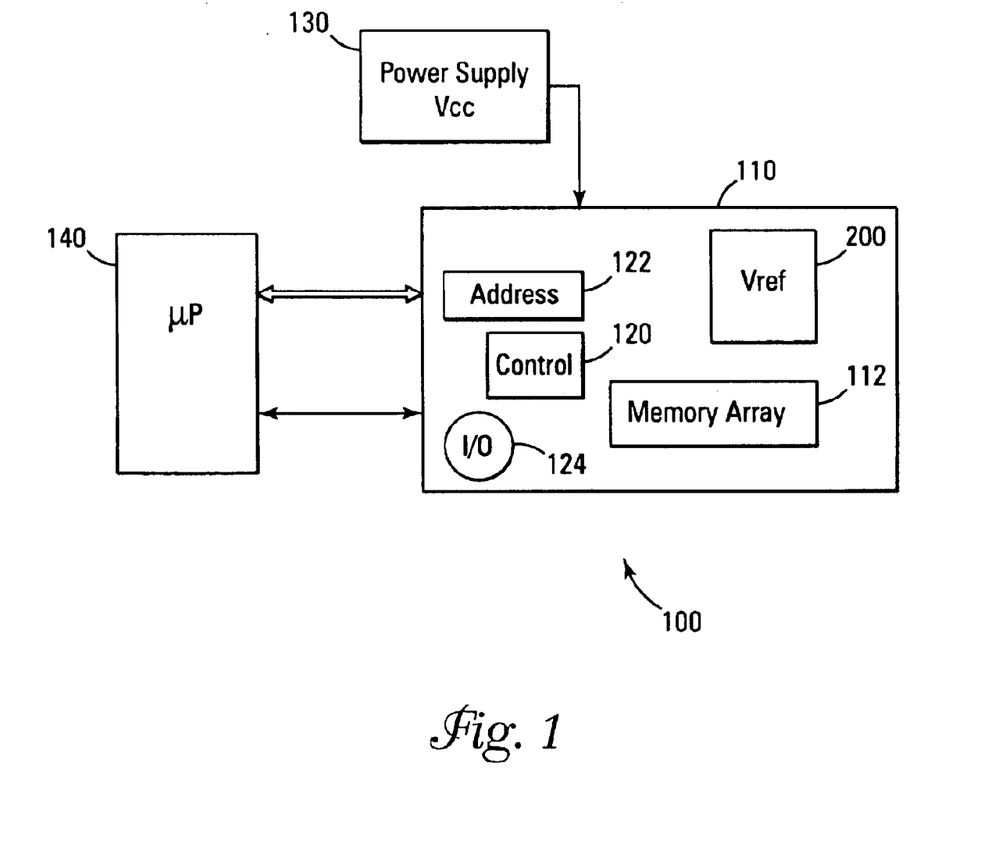
FIG. 1 is a block diagram of a memory circuit coupled to a processor and a voltage supply according to an embodiment of the invention.

FIG. 1 shows a computer system 100 including a memory 110, a power supply 130 and a processor 140. Memory 110 includes a memory array 112 of nonvolatile memory cells (which can be flash memory cells), an on-chip reference voltage source 200 for providing stable reference voltages for operation of the memory and a controller 120 that controls detailed operations of memory 110 such as the various individual steps necessary for carrying out writing, reading, and erasing operations. Memory 110 also includes an address decoder circuit 122 for decoding and selecting addresses provided by processor 140 to access appropriate memory cells in memory array 112, and an I/O circuit 124 for providing bi-directional communications between processor 140 and memory circuit 110.

Figure 2:
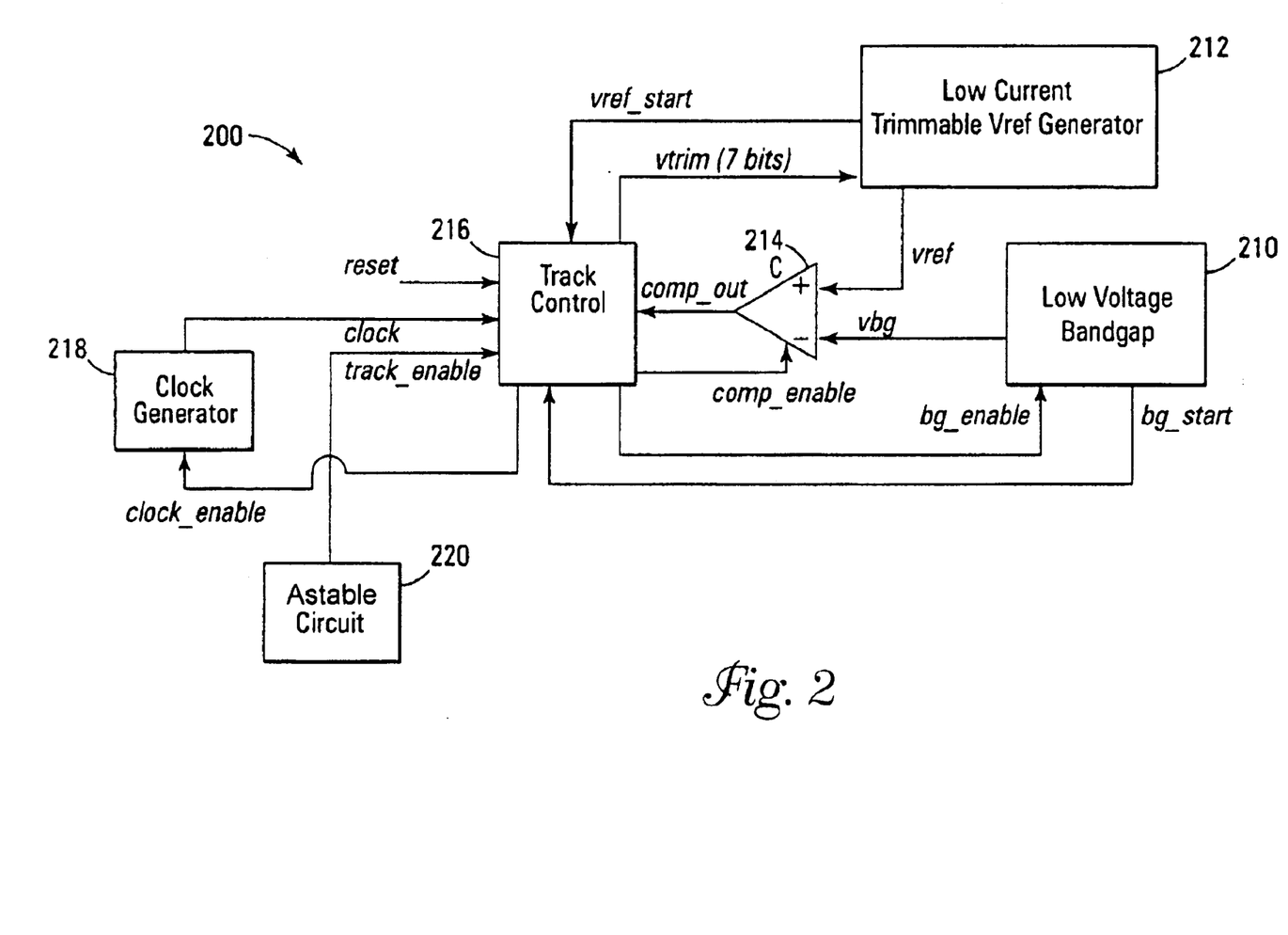
FIG. 2 is a block diagram of a Vref source circuit according to an embodiment of the invention.

FIG. 2 shows a simplified block diagram of a Vref source circuit 200 according to one example of the invention. The circuit includes low voltage bandgap reference 210, low current trimmable Vref source 212, differential sensing device 214, track control 216, clock generator 218 and astable circuit 220. Low voltage bandgap reference 210 is preferably a high precision bandgap reference voltage source that is set to a predetermined voltage. In operation, it may draw relatively high current, for example, in the range of 200 µA. Low current trimmable (adjustable) Vref source 212 is a relatively low current consumption Vref source that has relatively low precision over changes in Vcc, temperature, and process parameters. Differential sensing device 214 compares two input voltages and outputs a result that indicates which voltage is higher. Differential sensing device 214 may be a comparator or a differential amplifier or other differential voltage sensing device. Its inputs are the voltage reference outputs of low voltage bandgap reference 210 and of trimmable Vref source 212. Track control 216 includes logic circuitry for supervising the operation of Vref source circuit 200 and is clocked by a high frequency clock signal provided by clock generator 218.

Figure 3:
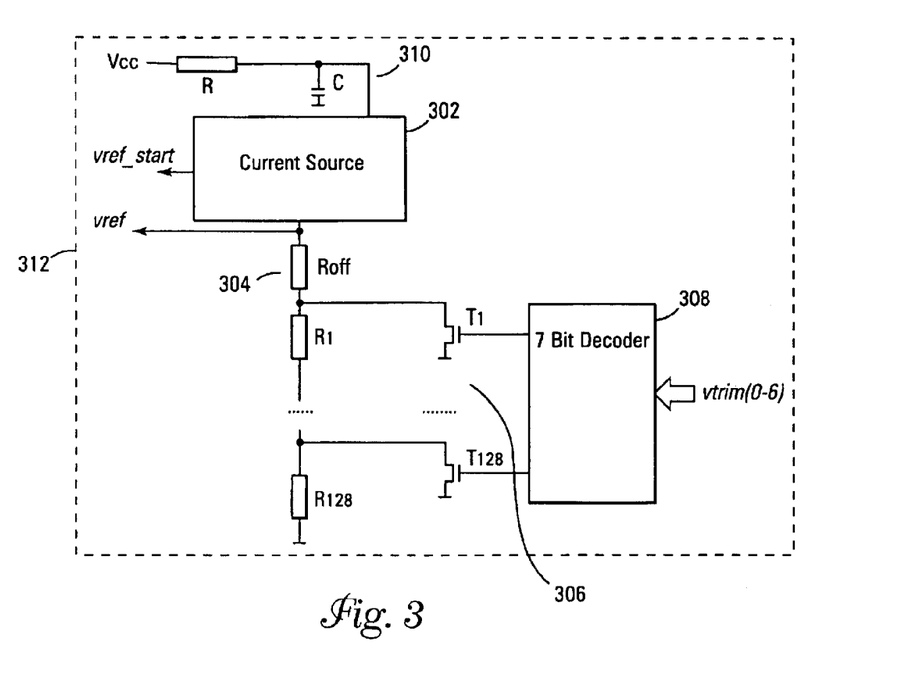
FIG. 3 is a block diagram showing additional details of components of the Vref source circuit according to an embodiment of the invention.

FIG. 3 shows trimmable Vref source 212 in more detail. In this example, trimmable Vref source 212 includes current source 302, RC filter 310 and decoder 308. Current Source 302 is powered by Vcc and feeds resistor ladder 304. Individual resistors of resistor ladder 304 are selected by switches 306. Switches 306 are activated by the output of decoder 308. In the example shown in FIG. 3, decoder 308 is a 7-bit decoder. Resistor ladder 304 thus includes a series of 128 resistors selectively tapped so that the resistors can be shunted to ground by any one of the switches 306. FIG. 3 shows 128 transistor switches, $T_1$–$T_{128}$, only one of which at any one time are selected by decoder 308 according to the value of the 7 bits of vtrim. Tolerance of the resistors of resistor ladder 304 corresponds to a Vref trimming resolution of 5 mV, more than adequate for all practical purposes in a flash memory. Other tolerances can, of course, be selected depending on the needs of a particular circuit design. RC filter 310 may be included to filter any relatively high frequency Vcc noise from reaching current source 302.

Vref source circuit 200 operates, in general, as follows., At power-up, a reset signal resets Track Control 216 to an initial state. The logic signal track_enable input to Track Control 216 is, however, initially at "0" preventing operation of Track Control 216 immediately following the reset. The output Vbg of the Low voltage Bandgap is also disabled by the bg_enable signal provided by track controller 216, which is at "0" following reset. Trimmable Vref source 212 activates, providing its output Vref to one input of differential sensing device 214. Differential sensing device 214 is also initially disabled by the comp_enable signal provided by track controller 216, which is at "0".

The track_enable signal input to track controller 216 is a periodic, relatively low frequency short pulse, of 1 KHz, for example, generated by low current astable circuit 220. Astable circuit 220 can be implemented as a current controlled oscillator, known to those of ordinary skill in the art. For example, a 4 µs period low current oscillator followed by a frequency divider (f/256), can be employed in order to reduce capacitance area. In the example, astable circuit 220 provides a 4 µs pulse every 1 ms. This duty cycle provides good tracking with minimal power consumption. The maximum time in which the tracking circuit is active, Tactive, in the worst case, can be calculated as follows:

$$Tactive = [Tclock*(2^N+k)] \quad \text{Formula 1}$$

where Tclock is the clock period; N is number of bits of the vtrim signal and k is the number of latency clock cycles, which will depend on the particular implementation. In the present example, k is 3, Tclock is 100 ns and N is 7. If the current consumption of low voltage bandgap reference 210 plus the current consumption of differential sensing device 214 plus the current consumption of track control 216 is Ipeak, then the average current consumption can be determined by:

$$Iav = Ipeak*Tactive/Ttrk\_enbl + Ilcr \quad \text{Formula 2}$$

where Ilcr is the current of low current trimmable Vref source 212, Ilcr is 5 µa, Iav is 10 µA, Ipeak is 200 µA, and Tactive is 128 µs. Thus, in this example, Ttrk_enbl is 5.12 ms. This example is based, of course, on the worst case. If, during normal tracking, Tactive is 5 times Tclock, then track_enable will be 20 µs. For this reason, a 1 kHz cycle for astable circuit 220 is sufficient.

The track_enable pulse also enables track control 216 to turn on clock generator 218 which runs at a much higher frequency than astable circuit 220, in the range of about 10 MHz, for example. After track_enable has transitioned to logic "1" clock generator 218 begins to run. The first clock pulse is received by track controller 216. Vref_start also by now has reached logic "1." Track control 216 switches bg_enable to "1", enabling power to low voltage bandgap reference 210. Track control 216 also switches Comp_enable to "1" thus enabling differential sensing device 214.

Low voltage bandgap reference 210 takes some time to stabilize its output voltage, Vbg, after power-up. Track control 216 will not actually start the tracking operation until bg_start goes to "1", signaling that low voltage bandgap reference 210 has a stable output. Once bg_start is "1", and, as soon as the next next clock pulse is received, track control 216 starts to analyze the comp_out signal of differential sensing device 214. If Vref is lower than Vbg, comp_out is "0" and the digital 7 bit output vtrim is incremented by 1. The vtrim signals trims or adjusts trimmable Vref source 212 to a higher Vref value. At the next clock cycle, comp_out is again evaluated by track control 216, and, if Vref is still too low, vtrim is again incremented by 1. This operation repeats until Vref is higher than Vbg. When comp_out transitions from "0" to "1" signaling that the tracking operation has been completed, comp_enable, clock_enable, and bg_enable go to "0" shutting off the differential sensing device 214, low voltage bandgap reference 210 and clock generator 218. Trimmable Vref source 212 is now trimmed essentially to the same value as the low voltage bandgap reference 210 and provides Vref to the whole flash memory, as needed.

After about 1 ms, at the first clock pulse after the track_enable rising edge, track control 216 resumes its operation. First, bg_enable and comp_enable to go "1" powering low voltage bandgap reference 210 and differential sensing device 214. As soon as the output Vbg is stable, bg_start goes to "1," again enabling operation of track control 216. Comp_out is then evaluated by track control 216. If adjustment of Vref is needed, vtrim signals are increased or decreased by 1 every clock pulse, thus fine-tuning trimmable Vref source 212. As the trimming is completed, (i.e., the device is calibrated) differential sensing device 214, low voltage bandgap reference 210 and clock generator 218 are again powered down.

Figure 4:
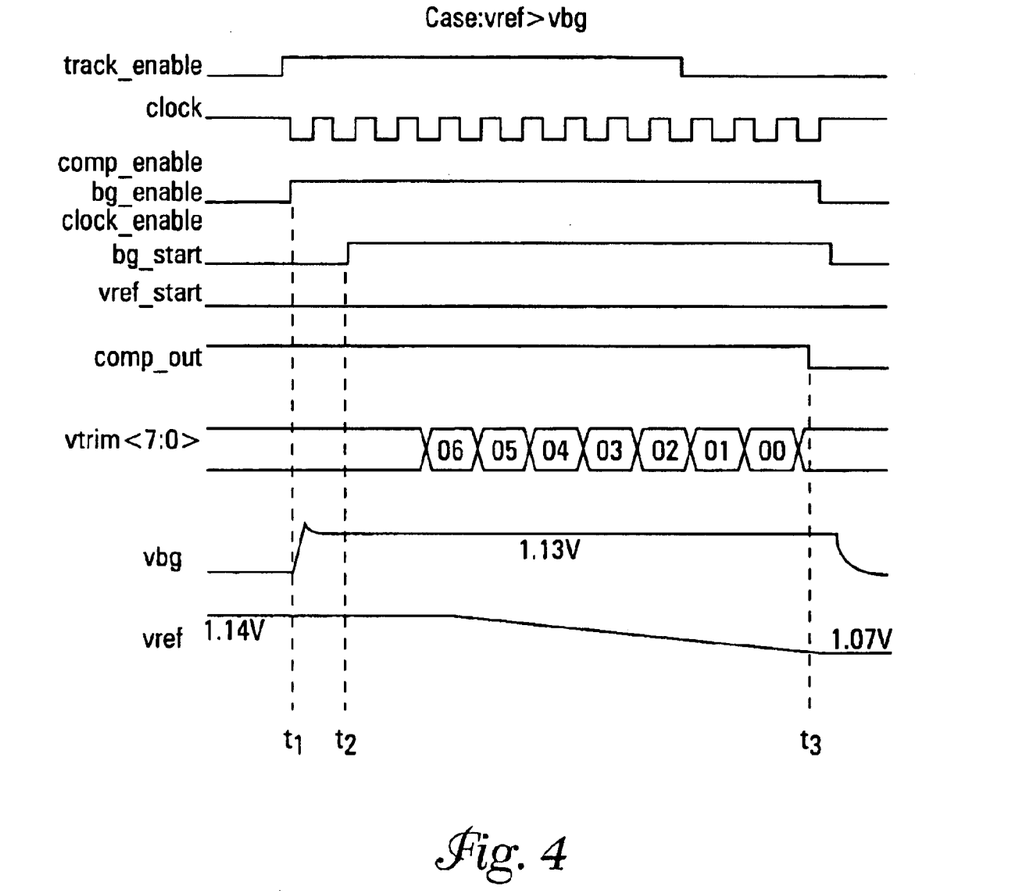
FIG. 4 is a timing diagram showing operation of a Vref source circuit according to an embodiment of the invention where Vref is greater than Vbg.
Figure 5:
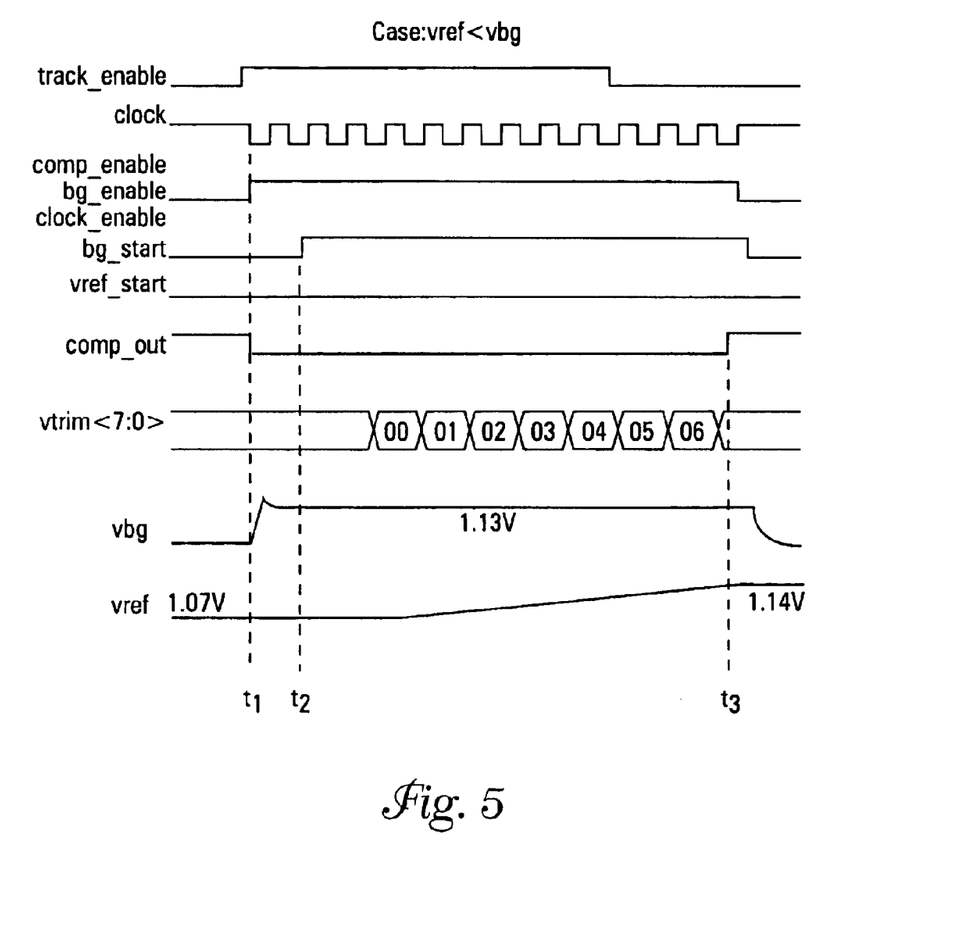
FIG. 5 is another timing diagram showing operation of a Vref source circuit according to an embodiment of the invention where Vref is less than Vbg.

The operation of the present invention is illustrated in the timing diagrams of FIGS. 4 and 5. FIG. 4 shows an example where Vref is greater than Vbg. FIG. 5 shows an example where Vref is less than Vbg. At $t_1$, Vref_start is already active. Track_enable transitions from "0" to "1," and Comp_enable, clock_enable, and bg_enable activate comparator 214 and low voltage bandgap source 210, respectively. Vbg ramps in response to bg_enable and then stabilizes. At $t_2$, bg_start goes to "1" signaling that Vbg is now stable. As soon as the next clock pulse comes in, track control 216 starts to analyze the comp_out signal. Adjustment will take place (trimming Vref down is shown in FIG. 4 and trimming verf up is illustrated in FIG. 5) until comp_out transitions at $t_3$. After trimming has been completed, comp_enable, clock_enable, bg_enable and bg_start transition to zero to conserve power.

Considerable power savings can be achieved with the present invention. Allowing for example 600 ns from the shut off state to stabilize Vbg, and an average of 2 clock cycles (200 ns, for example) for trimming, the trimming operation may require 1 µs. Since the period of the track_enable pulses is 1 ms, low voltage bandgap reference 210 and differential sensing device 214 are active and require power only for 1 µs every ms (duty cycle 1/1000). If their total operating current is 200 µA, for example, then the actual average current is 200/1000=0.2 µA. Considering that trimmable Vref source 212 typically draws 10 µA, the increment of 0.2 µA, (2% of the trimmable Vref source 212) is practically negligible. Current consumption may no doubt be even less in many instances.

Since low voltage bandgap reference 210 is stable over changes in temperature and Vcc voltage, as well as process spread, its stability is effectively transferred to the trimmable Vref source 212, with an additional power consumption penalty of only 0.2 µA. Of course, during the gap of 1 ms between track_enlable pulses there is no tracking control. This is not likely to present problems. Since process variations occur only at the time of fabrication of the memory they should not be a factor. Likewise, temperature variations are also negligible because they occur relatively slowly compared to the speed at which the invention operates. Slow Vcc variations can also be tracked without a problem. Thus, the only variations potentially affecting the stability of trimmable Vref source 212 would be any noise on Vcc occurring during the 1 ms time frame where there is no tracking control. If such noise is a problem, the trimmable Vref source 212 can easily be designed to be stable with fast Vcc variation occurring in the 1 ms time frame without consuming additional power, by means of a simple RC filter on its power supply Vcc. In conclusion, exceptional Vref stability is accomplished by embodiments of the invention with inexpensive additional circuitry and practically negligible current consumption.

What is claimed is:

1. A reference voltage source for an integrated circuit comprising:
   a first voltage reference that is adjustable;
   a second voltage reference;
   a differential sensing device to compare a voltage provided by the first voltage reference to a voltage provided by the second voltage reference;
   a controller to provide a trim control signal to the first voltage reference in response to an output of the differential sensing device for adjusting the first voltage reference and to provide a signal to power down the second voltage reference after the first voltage reference has been adjusted.

2. The reference voltage source for an integrated circuit of claim 1 wherein the first voltage reference is adjusted periodically.

3. The reference voltage source for an integrated circuit of claim 1 wherein the second voltage reference is reactivated to enable readjustment of the first voltage reference.

4. The reference voltage source for an integrated circuit of claim 3 wherein the second voltage reference is reactivated periodically.

5. The reference voltage source for an integrated circuit of claim 1 wherein the controller provides a digital trim control signal.

6. The reference voltage source for an integrated circuit of claim 1 wherein the controller functions in response to a clock and activates in response to a signal that switches at a frequency that is much lower than the frequency of the clock.

7. The reference voltage source for an integrated circuit of claim 1 wherein the first voltage source comprises a plurality of series connected resistors tapped by a plurality of switches selectively engaged in response to the trim signal from the controller.

8. The reference voltage source for an integrated circuit of claim 7 wherein the plurality of switches are selectively engaged in response to the trim signal from the controller by a decoder.

9. The reference voltage source for an integrated circuit of claim 1 wherein the first voltage source comprises a resistor ladder coupled to a current source, in which the resistors are selectively shunted by switches in response to the trim control signal.

10. The reference voltage source for an integrated circuit of claim 1 wherein the first voltage reference requires less current to operate than the second voltage reference.

11. The reference voltage source for an integrated circuit of claim 1 wherein the second voltage reference has higher precision than the first voltage reference.

12. The reference voltage source for an integrated circuit of claim 1, wherein the controller provides signals for deactivating the second voltage reference in response to a signal from the differential sensing device.

13. The reference voltage source for an integrated circuit of claim 12 wherein the controller deactivates the second voltage reference source after the first voltage source has reached a predetermined level.

14. The reference voltage source for an integrated circuit of claim 13 wherein the controller reactivates the second voltage reference source after a predetermined time.

15. The reference voltage source for an integrated circuit of claim 1 wherein the integrated circuit is a flash memory.

16. A method of generating a stable reference voltage for an integrated circuit comprising:
    providing a first reference voltage from a first reference voltage source;
    providing a second reference voltage from a second reference voltage source;
    comparing the first reference voltage to the second reference voltage;
    adjusting the first reference voltage in response to a difference between the first and second reference voltages; and
    deactivating the second voltage reference source after a predetermined time.

17. The method of providing a reference voltage for an integrated circuit of claim 16, further comprising reactivating the second voltage reference source after a predetermined time so that the first reference voltage source can be readjusted.

18. The method of providing a reference voltage for an integrated circuit of claim 16, further comprising powering down circuit components comprising the second voltage reference source after the first reference voltage has been adjusted.

19. The method of providing a reference voltage for an integrated circuit of claim 18, wherein the duty cycle of operation of the powered down components is much shorter than the duty cycle of operation of the first voltage reference source.

20. A method of providing a reference voltage for a low power memory circuit comprising:
    providing a voltage reference;
    adjusting a trimmable voltage reference source by comparing it to the voltage reference;
    deactivating the voltage reference after the trimmable voltage reference source has been adjusted; and
    using the trimmable voltage reference as a reference voltage in the low power memory circuit.

21. The method of providing a reference voltage for a memory circuit of claim 20 further comprising reactivating the voltage reference after a predetermined period so that the trimmable voltage reference source can be readjusted.

22. The method of providing a reference voltage for a memory circuit of claim 21 wherein the predetermined period is set by an astable circuit.

23. A system comprising:
    a processor; and
    a memory coupled to the processor, comprising:
       a first voltage reference that is adjustable;
       a second voltage reference;
       a differential sensing device to compare a voltage provided by the first voltage reference to a voltage provided by the second voltage reference;
       a controller to provide a trim control signal to the first voltage reference in response to an output of the differential sensing device for adjusting the first voltage reference and to provide a signal to power down the second voltage reference after the first voltage reference has been adjusted.

24. A reference voltage source for an integrated circuit comprising:

a first voltage reference that is adjustable;

a second voltage reference;

a differential sensing device to compare a voltage provided by the first voltage reference to a voltage provided by the second voltage reference;

a controller that provides a trim control signal to the first voltage reference and which sequences through states comprising:

a state to provide signals enabling circuit elements comprising the differential sensing device and second voltage reference;

a state to permit changes in the value of the digital trim control signal in response to signal comprising a signal from the second voltage source indicating that it has reached a predetermined output level, a signal from the first voltage reference that it is ready to be adjusted and a signal from the differential sensing device that a change is appropriate; and a state to power down circuit components comprising the second voltage reference after the first voltage reference has been adjusted.

25. A memory circuit comprising:

a first voltage reference that is adjustable;

a second voltage reference;

a differential sensing device to compare a voltage provided by the first voltage reference to a voltage provided by the second voltage reference;

a controller to provide control signals to circuit elements comprising the first voltage reference, the second voltage reference, and the differential sensing device and which transitions through states comprising:

a state to enable circuit elements comprising the differential sensing device and second voltage reference;

a state to permit changes in the value of the first voltage reference in response to a signal from the differential sensing device;

a state to power down circuit elements comprising the second voltage reference after the first voltage reference has been adjusted.

26. A memory circuit comprising a first voltage reference that is periodically calibrated to a second voltage reference by a control circuit that periodically powers down the second voltage reference.

27. A memory circuit comprising:

a trimmable voltage reference;

a voltage reference that is set to a predetermined value;

a comparator to compare a voltage provided by the trimmable voltage reference to a voltage provided by the voltage reference that is set to a predetermined value;

a controller to provide a trim control signal to the trimmable voltage reference in response to an output of the comparator for adjusting the first voltage reference and to provide a signal to power down the a voltage reference that is set to a predetermined value after the first voltage reference has been adjusted.

28. A memory circuit, comprising:

a low current Vref generator to provide a trimmable Vref voltage;

a low voltage reference to provide a predetermined reference voltage;

a comparator to compare the Vref voltage to the predetermined reference voltage and to signal whether the value of the Vref signal is greater than or less than the value of the predetermined reference voltage;

a controller to provide a trim signal to the low current Vref generator in response to a signal from the comparator and to transition an enable signal to the low voltage reference after the trim signal has been provided.

* * * * *

UNITED STATES PATENT AND TRADEMARK OFFICE
CERTIFICATE OF CORRECTION

PATENT NO. : 6,713,996 B2  
DATED : March 30, 2004  
INVENTOR(S) : Ercole Di Iorio It is certified that error appears in the above-identified patent and that said Letters Patent is hereby corrected as shown below:

<u>Title page,</u>  
Item [30], Foreign Application Priority Data, August 21, 2001 (IT)  
………..RM2001A0521. replace "RM2001A0521" with -- RM2001A000521 --

<u>Column 7,</u>  
Line 20, replace "response to signal comprising" with -- response to signals comprising --

<u>Column 8,</u>  
Line 23, replace "power down the a voltage" with -- power down the voltage --

Signed and Sealed this

Twenty-seventh Day of July, 2004

JON W. DUDAS  
*Acting Director of the United States Patent and Trademark Office*